(12) United States Patent
Hongo et al.

(10) Patent No.: US 6,615,854 B1
(45) Date of Patent: Sep. 9, 2003

(54) WAFER CLEANING APPARATUS

(75) Inventors: Akihisa Hongo, Tokyo (JP); Shinya Morisawa, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/572,432

(22) Filed: May 17, 2000

(30) Foreign Application Priority Data

May 19, 1999 (JP) ............................. 11-139183

(51) Int. Cl.$^7$ ................................. B08B 3/02

(52) U.S. Cl. .................. 134/148; 134/153; 134/902

(58) Field of Search ................. 134/137, 140, 134/147, 148, 153, 157, 99.2, 94.1, 902; 204/198, 224 R, 224 M (56) References Cited

U.S. PATENT DOCUMENTS

| | | | | |
|---|---|---|---|---|
| 3,953,265 A | * | 4/1976 | Hood | |
| 4,439,243 A | * | 3/1984 | Titus | |
| 4,489,740 A | * | 12/1984 | Rattan et al. | |
| 4,510,176 A | * | 4/1985 | Cuthbert et al. | |
| 4,518,678 A | * | 5/1985 | Allen | |
| 4,732,785 A | * | 3/1988 | Brewer | |
| 4,838,289 A | * | 6/1989 | Kottman et al. | |
| 4,968,375 A | * | 11/1990 | Sato et al. | |
| 5,176,783 A | * | 1/1993 | Yoshikawa | |
| 5,349,978 A | * | 9/1994 | Sago et al. | |
| 5,499,733 A | * | 3/1996 | Litvak | |
| 5,634,980 A | * | 6/1997 | Tomita et al. | |
| 5,688,411 A | * | 11/1997 | Kutsuzawa et al. | |
| 5,706,843 A | | 1/1998 | Matsuo | |
| 5,723,387 A | * | 3/1998 | Chen | |
| 5,783,097 A | * | 7/1998 | Lo et al. | |
| 5,879,577 A | * | 3/1999 | Weng et al. | |
| 5,897,379 A | * | 4/1999 | Ulrich et al. | |
| 6,012,966 A | * | 1/2000 | Ban et al. | |
| 6,027,630 A | * | 2/2000 | Cohen | |
| 6,062,288 A | * | 5/2000 | Tateyama | |
| 6,063,232 A | * | 5/2000 | Terasawa et al. | |
| 6,099,393 A | * | 8/2000 | Katagiri et al. | |
| 6,106,907 A | * | 8/2000 | Yoshikawa et al. | |
| 6,110,345 A | * | 8/2000 | Iacoponi | |
| 6,114,254 A | * | 9/2000 | Rolfson | |
| 6,117,778 A | * | 9/2000 | Jones et al. | |

(List continued on next page.)

FOREIGN PATENT DOCUMENTS

| | | |
|---|---|---|
| DE | 41 09 955 A1 | 10/1992 |
| JP | 1-253923 | 10/1989 |
| JP | 2-253620 | * 10/1990 |
| JP | 2-272738 | * 11/1990 |
| JP | 5-13322 | * 1/1993 |
| JP | 6-124887 | * 5/1994 |
| JP | 8-37143 | 6/1996 |

OTHER PUBLICATIONS

"Method Of And Apparatus For Cleaning Substrate" Ichiro Katakabe et al., U.S. patent application Ser. No. 09/679,305, filed Oct. 6, 2000.

"Method Of And Apparatus For Cleaning Substrate" Ichiro Katakabe et al., U.S. patent application Ser. No. 10/390,600, filed Mar. 19, 2003.

*Primary Examiner*—Frankie L. Stinson
(74) *Attorney, Agent, or Firm*—Wenderoth, Lind & Ponack, L.L.P.

(57) ABSTRACT

An object of the present invention is to provide a wafer cleaning apparatus for cleaning wafer that have received various processing such as copper plating and chemical mechanical polishing. An apparatus for cleaning front and back surfaces of a wafer with solution while rotating the wafer that hag been subjected to a fabrication process is disclosed. The apparatus comprises cleaning nozzles for spraying a cleaning solution, respectively, onto a front surface of the wafer that has been processed and onto a back surface thereof and also comprises an etching nozzle for spraying an etching solution onto a vicinity of the outer periphery of the wafer.

25 Claims, 6 Drawing Sheets

U.S. PATENT DOCUMENTS

| | | | |
|---|---|---|---|
| 6,140,233 A | * | 10/2000 | Kwag et al. |
| 6,165,050 A | * | 12/2000 | Ban et al. |
| 6,180,020 B1 | * | 1/2001 | Moriyama et al. |
| 6,254,760 B1 | | 7/2001 | Shen et al. |
| 6,258,220 B1 | | 7/2001 | Dordi et al. |
| 6,265,323 B1 | * | 7/2001 | Nakamura et al. |
| 6,265,328 B1 | * | 7/2001 | Henely et al. |
| 6,294,059 B1 | * | 9/2001 | Hongo et al. |
| 6,332,835 B1 | * | 12/2001 | Nishimura et al. |
| 6,333,275 B1 | | 12/2001 | Mayer et al. |
| 6,380,086 B1 | * | 4/2002 | Robinson et al. |
| 6,387,190 B1 | * | 5/2002 | Aoki et al. |
| 6,413,436 B1 | | 7/2002 | Aegerter et al. |

\* cited by examiner

WAFER CLEANING APPARATUS

BACKGROUND OF THE INVENTION

1. Field of the Invention

The present invention relates to a wafer cleaning apparatus for cleaning wafer, which are processed by various processing steps such as plating and chemical mechanical polishing.

2. Description of the Related Art

When metallic materials such as copper attach themselves to the surfaces and edges of semiconductor wafer electrochemically as metallic copper, they become stable and cannot be removed by washing with pure water. Copper adhering in such a manner will diffuse into silicon wafer during heat treatment, and causes problems in device performances.

Figure 1:
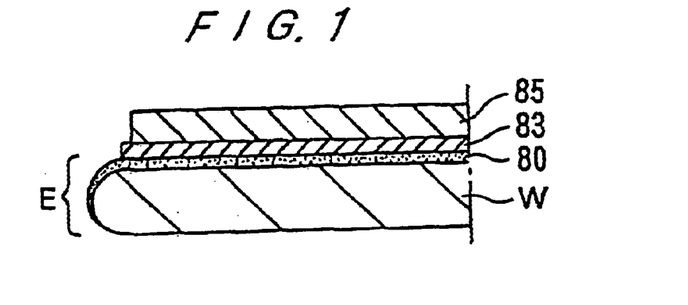
FIG. 1 is an enlarged schematic view of a wafer W showing an edge portion and portions therearound.

On the other hand, a copper seed layer is currently formed as a pretreatment for copper plating by sputtering copper (or by CVD) on the silicon wafer, and the trend is to apply the layer over the entire front surface of the wafer, because it is a more efficient use of the area. That is, as shown in FIG. 1, a barrier layer 80 is formed on the front surface of the wafer W extending to its edge section E, a Cu seed layer 83 is formed thereon, and a plating layer 85 is formed on the seed layer 83.

Figure 2:
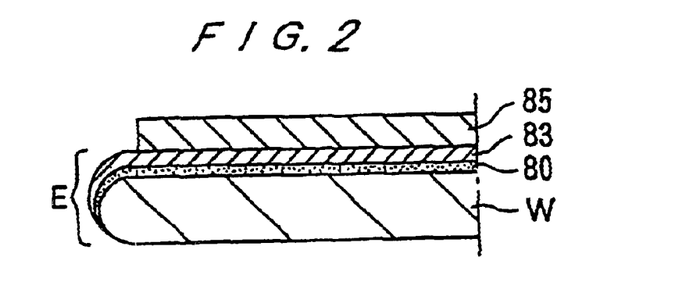
FIG. 2 is an enlarged schematic view of a wafer W showing problems with conventional techniques.

However, when a Cu seed layer 83 of 100 nm, for example, is formed by sputtering on the entire front surface of the wafer W, a sputtered Cu layer is formed not only on the front surface of the wafer but a thin sputtered Cu layer is formed also on the edge section E of the wafer as shown in FIG. 2. On the other hand, the formation of the plating layer 85 on the wafer W is carried out by sealing the outer peripheral section of the wafer W so as to prevent the plating layer from extending to the back surface of the wafer W. Therefore, the plating layer 85 can be formed only on the front surface of the wafer W not extending to the edge thereof, as shown in FIG. 2. For this reason, a portion of the Cu seed layer 83 remains on the edge section E and in the vicinity thereof as a thin layer. The residual Cu layer in such places can detach and be removed from the wafer during transport or processing of plated wafers or chemically mechanically polished (CMP) wafers, thereby leading to a high probability of causing Cu crop-contamination.

Also, it is difficult to prevent Cu from adhering to the back surface and edge of the wafer even if the edge and the back surface are protected by sealing the outer periphery thereof.

SUMMARY OF THE INVENTION

The present invention has been derived in view of the background problems outlined above, and an object of the present invention is to resolve such current problems and provide a wafer cleaning apparatus for completely cleaning surfaces of wafer processed by copper plating, a CMP process or so on.

The present invention provides an apparatus for cleaning front and back surfaces of a wafer while rotating the wafer that has been subjected to a fabrication process. The apparatus comprises: cleaning nozzles for spraying a cleaning solution, respectively, onto a front surface of the wafer that has been processed and onto a back surface thereof; and an etching nozzle for spraying an etching solution onto a vicinity of an outer periphery of the wafer.

According to cleaning the processed front surface of the wafer, particulate matter and detached copper are eliminated therefrom. According to cleaning the back surface of the wafer, particulate matter and/or copper adsorbed as metallic copper, are eliminated. And according to etching the edge portion of the wafer, it is possible to forcefully eliminate a thin copper film by etching.

As explained above, the present invention enables both sides and edges of the wafer to be cleaned at the same time as well as preventing potential device problems caused by metals, ouch as copper, adhering to the edge section of the wafer. That is, device performance problems caused by contamination from adhered metal on the edge section and back surface of the wafer, and problems of cross contamination caused by detached metal film from the copper formed on the edge section, are prevented. Thus, the invention provides beneficial effects of facilitating ideal cleaning of processed wafer that received various processing such as copper plating and a CMP process that follows the plating process.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENT

Preferred embodiment of the present invention will be explained in detail in the following with reference to the drawings.

Figure 3:
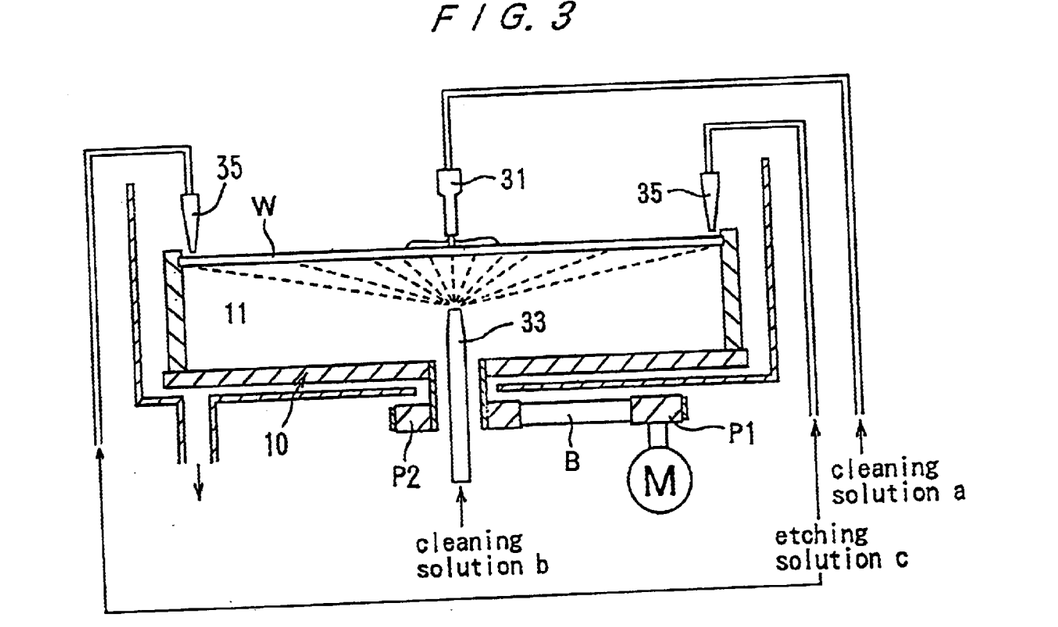
FIG. 3 is a schematic diagram of the fundamental structure of a wafer cleaning apparatus of the present invention.

FIG. 3 shows a schematic diagram of the fundamental structure of a wafer cleaning apparatus of the present invention. As shown in this diagram, the wafer cleaning apparatus is comprised of a rotation mechanism 10 for holding and rotating a wafer W, two cleaning nozzles 31, 33, and an etching nozzle 35. Each of these components will be explained below.

The rotation mechanism 10 includes a motor M go that wafer holding device 11 can be rotated through a belt B and pulleys P1, P2. Only two supporting portions of a wafer holding device are shown in this diagram, but in practice, 4~8 supporting portions of the wafer holding device are provided, and are arranged so as to hold an outer periphery of the wafer W to maintain the wafer W horizontal. The wafer may be oriented so that the front surface thereof faces either upwardly or downwardly.

On the other hand, the cleaning nozzle 31 is disposed facing close to the front surface of the wafer W, which is a surface that has been fabricated such as being plated or subjected to a CMP process. Gleaning solution from the nozzle is directed to the center of the wafer W. The cleaning nozzle 31 should be disposed below the wafer when the fabrication surface (front surface) of the wafer faces downwardly.

Cleaning solution "a" prayed from the cleaning nozzle 31 should be a liquid substance that does not etch copper and is effective in removing metal and particulate contamination. For example, any one of pure water, diluted sulfuric acid, diluted hydrofluoric acid (DHF), ionized water, 2-stage processing with dilute hydrofluoric acid and ozonized water, and 2-stage processing with hydrogen peroxide ($H_2F_2$) and diluted hydrofluoric acid may be used as necessary.

Next, the cleaning nozzle 33 is disposed facing the backside of the wafe; that is, the surface that has not been subjected to fabrication such as plating or a CMP process. The cleaning nozzle 33 should be disposed above the wafer when the back surface of the wafer faces upwardly. The cleaning nozzle 33 is constructed in such a way that when the back surface of the wafer W faces downwardly, cleaning solution is sprayed in a shape of a cone.

Cleaning solution "b" sprayed from the cleaning nozzle 33, should be capable of removing Cu adhered on a silicon wafer when compared to the solution "a", which is sprayed on the front or fabricated surface of the wafer. The cleaning solution "b" may use, for example, any one of pure water, diluted sulfuric acid, diluted hydrofluoric acid, 2-stage processing with ozonized water and diluted hydrofluoric acid, and 2-stage processing with hydrogen peroxide and diluted hydrofluoric acid, as necessary.

Figure 4:
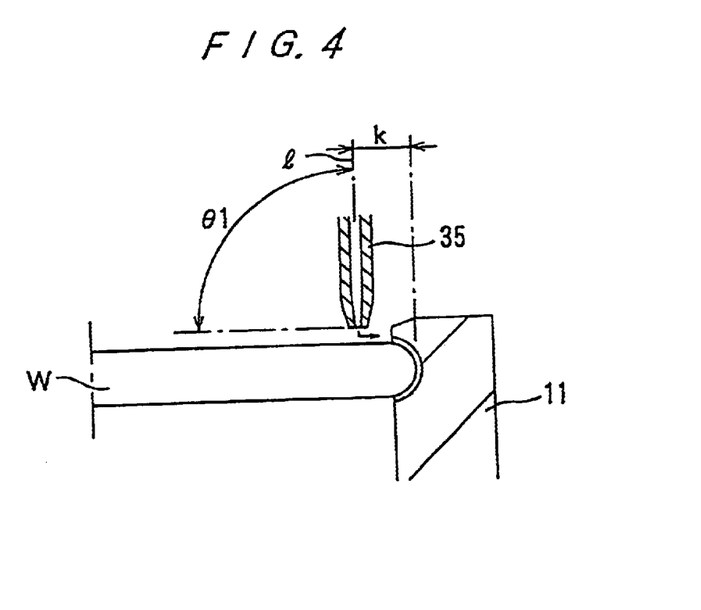
FIG. 4 is a diagram showing positioning of an etching nozzle.

As shown in FIG. 4, the etching nozzle 35 is installed so that the spray opening of the nozzle is positioned at a specific distance so that k is less than 5 mm (k≦5 mm) from the edge section of the wafer W, and that the direction of the center line l of the spray opening at the tip of the etching nozzle 35 is at right angles (θ1=90°) relative to the surface of the wafer W.

Figure 5:
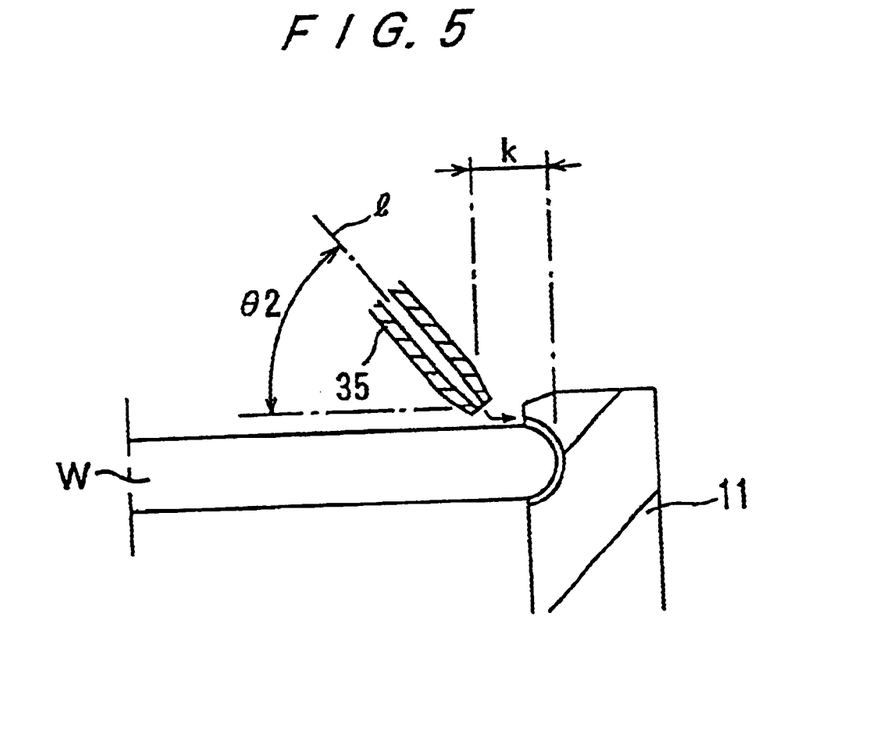
FIG. 5 is a diagram showing another positioning of the etching nozzle.

The etching nozzle 35 may be installed, as shown in FIG. 5 also, so that the spray opening of the nozzle is positioned at a specific distance so that k is less than 5 mm (k≦5 mm) from the edge section of the wafer W, and that the direction of the center line l of the spray opening at the tip of the etching nozzle 35 is inclined towards an outer edge at an angle other than right angles (θ2<90°) relative to the surface of the wafer W.

Also, although only one etching nozzle 35 is provided in this embodiment, it is permissible to provide a plurality of etching nozzles. It is preferable that the fluid stream ejected from the etching nozzle 35 be shaped to a fine point as much as possible so as to produce well defined etching boundaries.

Etching solution "C" to be sprayed from the etching nozzle 35 should be selected so that its purpose is to etch away the copper. For example, such a solution may be any one of a mixture of sulfuric acid and hydrogen peroxide, and a 2-stage processing based on sodium persulfate, sulfuric acid, hydrochloric acid, nitric acid, ionized water or ozonized water and diluted hydrofluoric acid, as necessary.

Next, the operation of the wafer cleaning apparatus will be explained. That is, a wafer W that has been subjected to a fabrication process such as copper plating or a CMP process is held in the wafer holding device 11, as shown in FIG. 1, with the surface to be fabricated (front surface) facing upwardly, and the motor M is operated to rotate the wafer W. Cleaning solutions "a" and "b" are sprayed from the cleaning nozzles 31, 33, and concurrently, an etching solution "c" is sprayed from the etching nozzle 35. Or, the etching solution "c" is sprayed from the etching nozzle 35 only initially for a given period of time, after which the cleaning solutions are sprayed from the nozzles 31, 33.

The cleaning solution "a" sprayed from the cleaning nozzle 31 rushes to the center section of the front surface of the wafer W, and is then spread on the wafer surface throughout by the rotational action of the wafer W. Thereby, metal and particulate contaminants are washed away from the front surface of the wafer W, thus cleaning the front surface of the wafer W.

The cleaning solution "b" sprayed from the cleaning nozzle 33 rushes to the back surface of the wafer W in a shape of a cone, and is spread out along the entire back surface by the rotational action of the wafer W, thereby removing metal and particulate contaminants from the back surface of the wafer W and cleaning the back surface thereof. It is permissible to revere the facing direction of the front/back surfaces of the wafer W.

Figure 6:
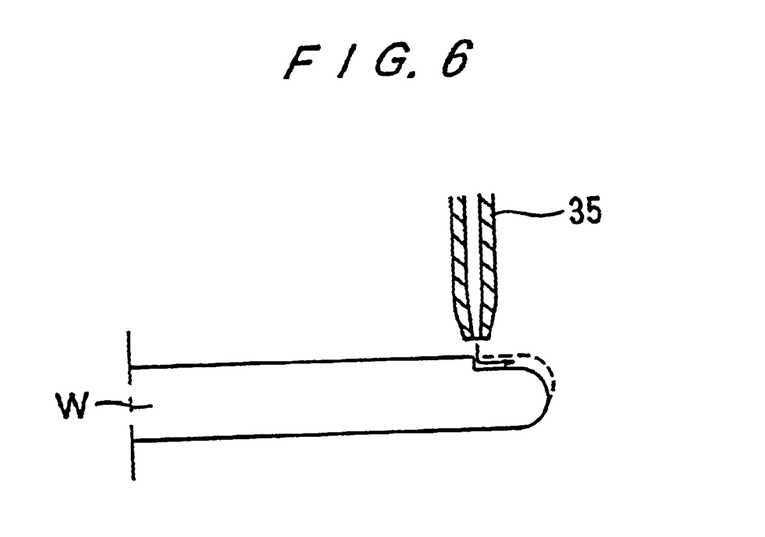
FIG. 6 is an enlarged schematic view of a wafer being etched.

In the meantime, the etching solution "c" sprayed from the etching nozzle 35 rushes to the peripheral portion of the surface of the wafer W at right angles, as shown by the arrow in FIG. 4. However, because the wafer W is rotating, it flows from the ejected position toward the outside by centrifugal force, and flows only to the outer periphery thereof. This action causes only the outer periphery, where the etching liquid "c" has adhered, to be selectively etched as shown in FIG. 6. In other words because of the action of this selective etching, it is possible to remove an unnecessary thin Cu layer, formed by sputtering and the like on the edge section E of the wafer W shown in FIG. 2, and create the condition shown in FIG. 1. Therefore, there is no danger of the adhered Cu causing performance problems in a device during subsequent heating processes, or causing cross contamination by Cu during transport or post processing of the wafer W.

Figure 7:
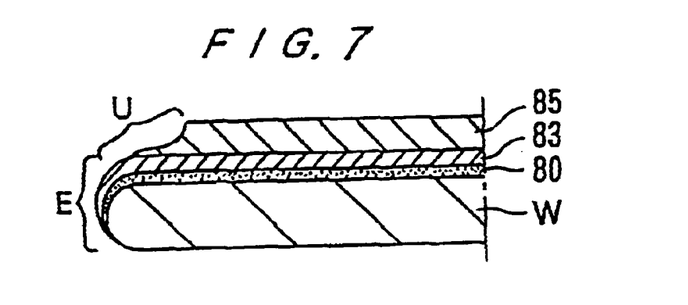
FIG. 7 is an enlarged schematic view of a wafer W having a poorly-defined step section of the outer periphery of a plating layer.
Figure 8:
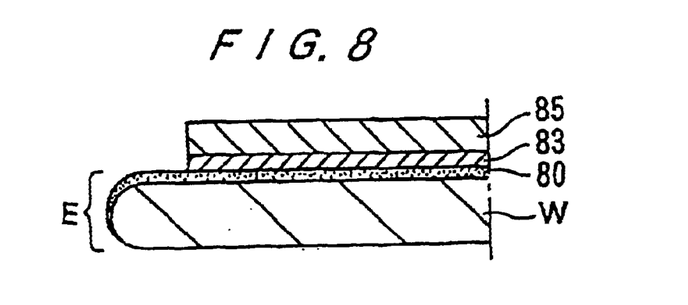
FIG. 8 is an enlarged schematic view of a wafer W whose outer periphery of the plating layer is also etched.

Also, when the step produced by a seal on the outer periphery of the plating layer 85 is not well defined, as illustrated in FIG. 7, a thin portion U is also formed on the plating layer 85 and may cause detachment. Therefore, it is necessary to etch seed layer 83 and the plating layer 85 together at thin portion U. When this thin portion U is selectively etched as described above, the condition shown in FIG. 8 can be obtained.

On the other hand, when the etching nozzle 35 is installed so that it is inclined away from the vertical toward the outer periphery as shown in FIG. 5, it is obvious that only the outer portion of the wafer W is selectively etched to produce the effects described above.

In the above embodiment, copper is used as an object metal for etching treatment, but this invention is not limited to copper, so that the invention can be applied to other metals such as gold, silver, or solder. Also, there are many types of rotational devices for the wafer, and any type of rotation device may be used so as long as rotational action can be produced.

Because the wafer cleaning apparatus is used for cleaning wafers that have been subjected to copper plating or CMP process, it is preferable that the wafer cleaning apparatus is constructed as an integrated unit by combining it with a plating section for performing copper plating or a CMP section for performing chemical mechanical polishing.

Figure 9A:
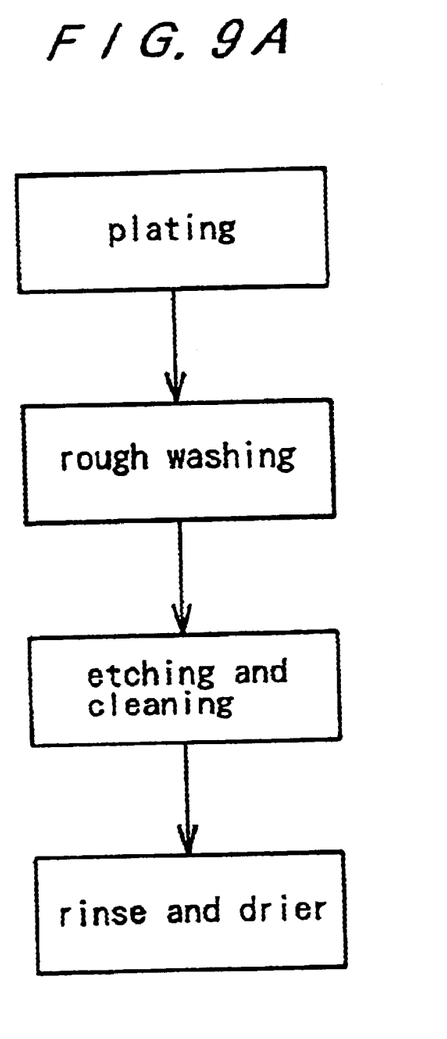
FIG. 9A is a diagram of an example of a processor of integrating a plating section and the present wafer cleaning apparatus into one unit.
Figure 9B:
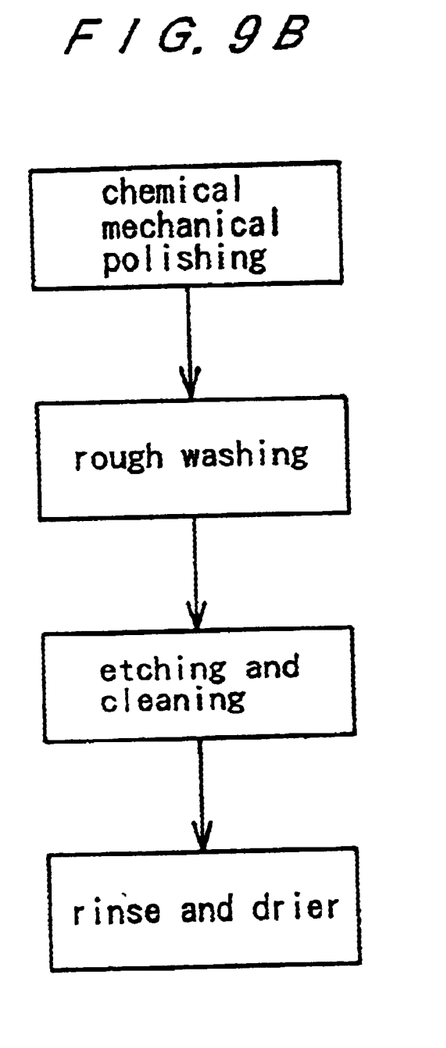
FIG. 9B is a diagram of an example of a process of integrating a CMP section and the present wafer cleaning apparatus into one unit.

FIG. 9A shows an example of the process performed by a combined unit of a plating section and the wafer cleaning apparatus, and FIG. 9B shows an example of the process performed by a combined unit of a CMP section and the wafer cleaning apparatus.

Figure 10:
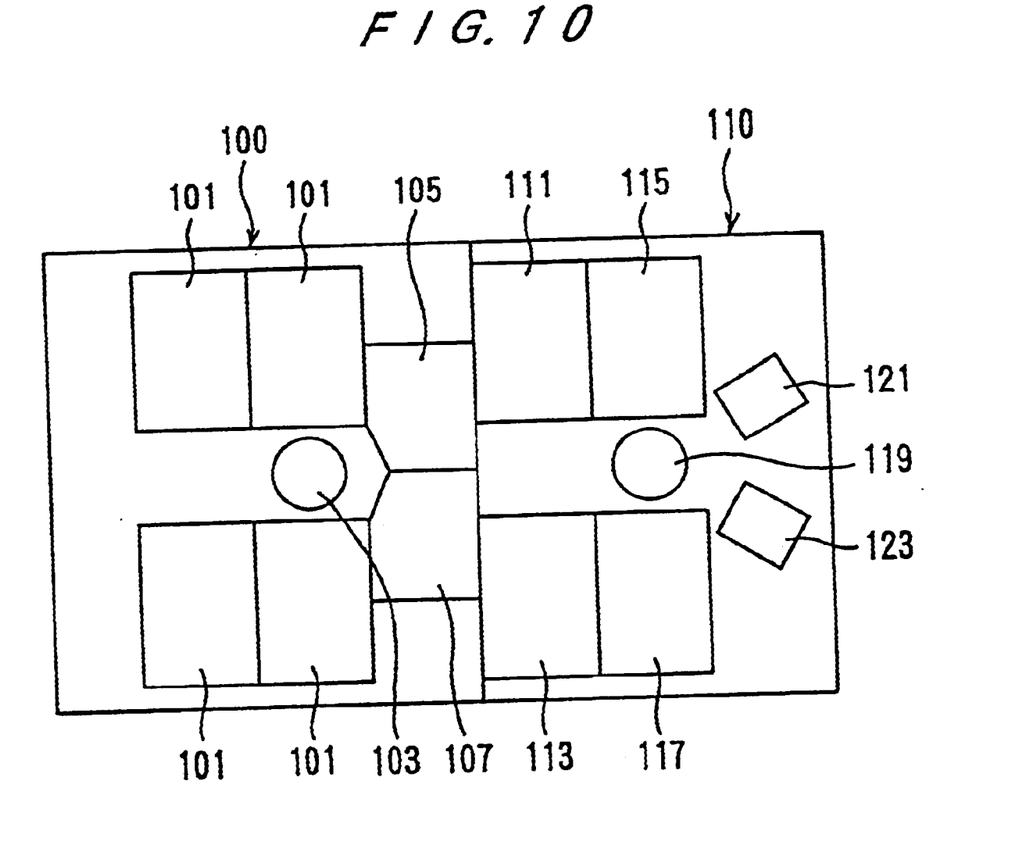
FIG. 10 is a diagram of an example of an apparatus produced by integrating a plating section and the present wafer cleaning apparatus into one unit.

FIG. 10 shows a schematic diagram of an example of an apparatus that combines a copper plating section and the wafer cleaning apparatus. As shown in this diagram, a plating section 100 is comprised of a plurality of plating vessels 101, a robot 103, a loading stage 105 and a rough wash section 107. And, a cleaning section 110 is comprised of the present wafer cleaning apparatuses 111, 113, rinser dryer 115, 117, a robot 119, a loading wafer cassette 121, and an unloading wafer cassette 123. One wafer at a time is removed from the loading wafer cassette 121 by the robots 119, 103 and is transported to the plating vessel 101 by way of the loading stage 105 for plating. Then, the plated wafer is washed in the rough washing section 107, and is etched in the present wafer cleaning apparatuses 111, 113 to etch the front and back surfaces and the outer periphery of the wafer. Then, the wafer is passed through the rinser dryers 115, 117 to clean and dry the wafer, and the dried wafer is returned to the unloading wafer cassette 123. In other words, a plating operation and a cleaning operation are carried out in an interleaved manner on each wafer.

Figure 11:
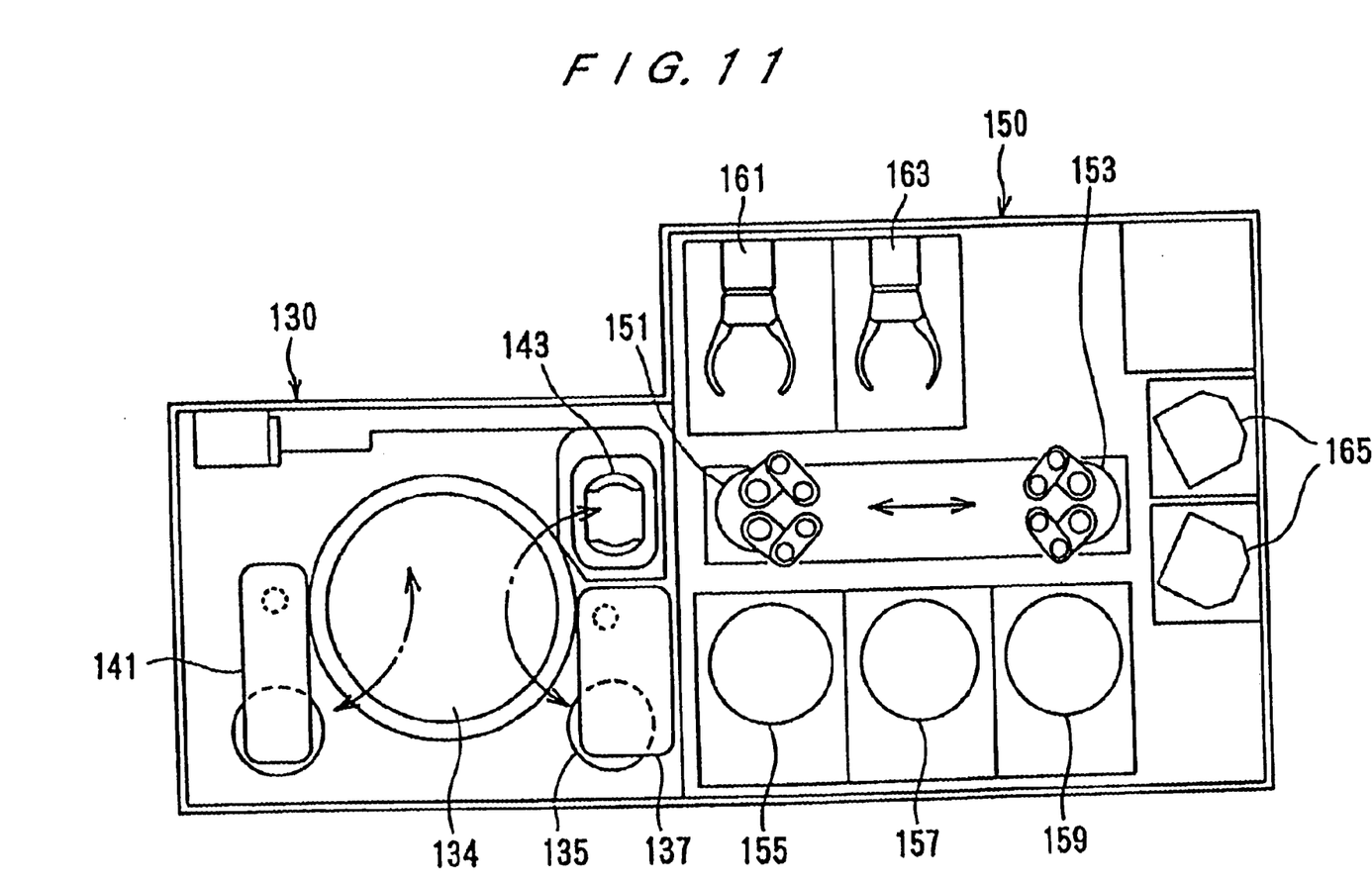
FIG. 11 is a diagram of an example of an apparatus produced by integrating a CMP section and the present wafer cleaning apparatus into one unit.

Also, FIG. 11 shows a schematic diagram of an example of the apparatus that combines CMP and the present wafer cleaning apparatus. As shown in this diagram, a CMP section 130 is comprised of a turntable 134 provided with a polishing surface, a rotating top ring 137 having a top ring head 135 for holding a wafer; a dresser 141 for dressing the polishing surface; and a pusher 143 for exchanging a wafer with the top ring head 135. A cleaning section 150 is comprised of a primary washer 155; a secondary washer 157; a spin dryer 159; robots 151, 153; wafer inverter 161, 163 and wafer loading/unloading cassette 165. The wafers are taken one at a time from the wafer cassette 165, and are mounted on the top ring head 135 by way of the wafer pusher 143. Then, the wafer is subjected to chemical mechanical polishing using the polishing surface of the turntable 134, and is again handled by the wafer pusher 143 for rinsing in the primary washer 155 and the secondary washer 157. Then the wafer is spin dried in the spin dryer 159, and is returned to the wafer cassette 165. In other words, CMP operations and a cleaning operation are carried out in an interleaved manner on each wafer. The primary washer 155 may be represented by the present wafer cleaning apparatus.

Although certain preferred embodiments of the present invention have been shown and described in detail, it should be understood that various changes and modifications may be made therein without departing from the scope of the appended claims.

What is claimed is:

1. An apparatus for plating a metal film onto a surface of a seed layer of a substrate, for cleaning the substrate and the metal film, and for etching the metal film, comprising:
   a plating section having a plating device for plating a metal film onto a surface of a seed layer of a substrate;
   a cleaning section having a cleaning device, said cleaning device including
      (i) a rotation mechanism for holding and rotating the substrate with the metal film plated thereon facing upwardly, and
      (ii) at least one first nozzle for ejecting an etching solution only onto a peripheral portion of the metal film for removing the peripheral portion of the metal film and a peripheral portion of the seed layer; and
   a robotic mechanism for transporting the substrate with the metal film plated thereon from said plating section to said cleaning section.

2. The apparatus according to claim 1, wherein said cleaning device further includes a second nozzle for ejecting a cleaning solution onto a backside surface of the substrate for removing metal adhered to the backside surface.

3. The apparatus according to claim 2, wherein said cleaning device further comprises a third nozzle for supplying a cleaning solution onto a central portion of the metal film, wherein the cleaning solution is for removing metal and particulate contaminants from the metal film and is not for etching the metal film.

4. The apparatus according to claim 3, wherein said at least one first nozzle is for ejecting the etching solution onto the peripheral portion of the metal film while said third nozzle is supplying the cleaning solution onto the central portion of the metal film.

5. The apparatus according to claim 2, wherein said second nozzle is for ejecting the cleaning solution onto the backside surface of the substrate for removing from the backside surface in its entirety metal adhered to the backside surface.

6. The apparatus according to claim 1, wherein said plating device comprises a plating vessel.

7. The apparatus according to claim 1, wherein said plating device comprises a plurality of plating vessels.

8. The apparatus according to claim 1, wherein said cleaning device further comprises a second nozzle for supplying a cleaning solution onto a central portion of the metal film, wherein the cleaning solution is for removing metal and particulate contaminants from the metal film and is not for etching the metal film.

9. The apparatus according to claim 8, wherein said at least one first nozzle is for ejecting the etching solution onto the peripheral portion of the metal film while said second nozzle is supplying the cleaning solution onto the central portion of the metal film.

10. The apparatus according to claim 1, wherein said at least one first nozzle is arranged to be inclined relative to a surface of the metal film while said at least one first nozzle is ejecting the etching solution onto the peripheral portion of the metal film.

11. The apparatus according to claim 1, wherein said at least one first nozzle is arranged to be inclined relative to the surface of the metal film so as to eject the etching solution onto the peripheral portion of metal film at given distance from an edge of the substrate.

12. The apparatus according to claim 1, wherein said at least one first nozzle is for ejecting an etching solution selected from sodium persulfate, sulfuric acid, hydrochloric acid, ionized water, ozonized water, diluted hydrofluoric acid, and a mixture of sulfuric acid and hydrogen peroxide onto the peripheral portion of the metal film.

13. The apparatus according to claim 1, wherein said at least one first nozzle comprises a plurality of etching nozzles.

14. The apparatus according to claim 1, wherein said plating section is for plating a metal film selected from gold, silver, copper and solder onto the surface of the seed layer of the substrate.

15. The apparatus according to claim 1, further comprising a rough wash section to wash the substrate with the metal film thereon before removing the peripheral portion of the metal film and the peripheral portion of the seed layer via the etching solution ejected by said at least one first nozzle.

16. The apparatus according to claim 15, wherein said robotic mechanism includes a first robot for transporting the substrate from said plating device to said rough wash section, and a second robot for transporting the substrate from said rough wash section to said cleaning device.

17. The apparatus according to claim 1, further comprising a dryer to dry the substrate after removing the peripheral portion of the metal film and the peripheral portion of the seed layer via the etching solution ejected by said at least one first nozzle.

18. The apparatus according to claim 1, wherein said rotation mechanism includes a holding deice to hold an outer periphery of the substrate.

19. An apparatus for plating a metal film onto a surface of a seed layer of a substrate, for cleaning the substrate and the metal film, and for etching the metal film, comprising:
a plating device for plating a metal film onto a surface of a seed layer of a substrate;
a cleaning device including
(i) a rotation mechanism for holding and rotating the substrate with the metal film plated thereon facing upwardly, and
(ii) at least one first solution supplier for ejecting an etching solution only onto a peripheral portion of the metal film for removing the peripheral portion of the metal film and a peripheral portion of the seed layer; and
a transport mechanism for transporting the substrate with the metal film plated thereon from said plating device to said cleaning device.

20. The apparatus according to claim 19, wherein said cleaning device further includes a second solution supplier for ejecting a cleaning solution onto a backside surface of the substrate for removing metal adhered to the backside surface.

21. The apparatus according to claim 19, wherein said cleaning device further comprises a second solution supplier for supplying a cleaning solution onto a central portion of the metal film, wherein the cleaning solution is for removing metal and particulate contaminants from the metal film and is not for etching the metal film.

22. The apparatus according to claim 21, wherein said first solution supplier is for ejecting the etching solution onto the peripheral portion of the metal film while said second solution supplier is supplying the cleaning solution onto the central portion of the metal film.

23. The apparatus according to claim 19, wherein said at least one first solution supplier comprises a plurality of etching nozzles.

24. The apparatus according to claim 19, further comprising a rough wash section to wash the substrate with the metal film thereon before removing the peripheral portion of the metal film and the peripheral portion of the seed layer via the etching solution ejected by said at least one first solution supplier.

25. The apparatus according to claim 19, further comprising a dryer to dry the substrate after removing the peripheral portion of the metal film and the peripheral portion of the seed layer via the etching solution ejected by said at least one first solution supplier.

* * * * *